United States Patent [19]
Hsu et al.

[11] Patent Number: 5,818,085
[45] Date of Patent: Oct. 6, 1998

[54] BODY CONTACT FOR A MOSFET DEVICE FABRICATED IN AN SOI LAYER

[75] Inventors: Ching-Hsiang Hsu, Hsin Chu; Shyh-Chyi Wong, Taichang; Mong-Song Liang, HsinChu; Steve S. Chung, Hsinchu, all of Taiwan

[73] Assignee: Taiwan Semiconductor Manufacturing Company, Ltd., Hsin-Chu, Taiwan

[21] Appl. No.: 892,337

[22] Filed: Jul. 14, 1997

Related U.S. Application Data

[60] Continuation of Ser. No. 697,708, Aug. 28, 1996, which is a division of Ser. No. 565,201, Nov. 9, 1995, Pat. No. 5,573,961.

[51] Int. Cl.$^6$ .................................................. H01L 27/01
[52] U.S. Cl. ............................................. 257/347; 257/351
[58] Field of Search .................................... 257/347, 288, 257/351, 507

[56] References Cited

U.S. PATENT DOCUMENTS

| | | |
|---|---|---|
| 3,617,824 | 11/1971 | Shinoda et al. ................... 317/235 R |
| 4,906,587 | 3/1990 | Blake .................................. 437/41 |
| 4,946,799 | 8/1990 | Blake et al. ........................ 437/41 |
| 5,185,280 | 2/1993 | Houston et al. ..................... 437/44 |
| 5,294,821 | 3/1994 | Iwamatsu ........................... 257/351 |
| 5,463,238 | 10/1995 | Takahashi et al. ................. 257/351 |
| 5,554,861 | 9/1996 | Mano et al. ........................ 257/71 |
| 5,591,650 | 1/1997 | Hsu et al. ........................... 437/21 |

*Primary Examiner*—Sara W. Crane
*Attorney, Agent, or Firm*—George O. Saile; Stephen B. Ackerman

[57] ABSTRACT

A MOSFET device structure, on a silicon on insulator layer, in which a body contact to the silicon on insulator layer exists, has been developed. The MOSFET device structure features a heavily doped P type body contact region in a lightly doped source and drain region of the MOSFET device structure, formed from an ion implantation through a metal silicide layer. The addition of the body contact results in more controllable device characteristics, in terms of drain currents, etc., than for counterparts fabricated in silicon on insulator layer, without the use of a body contact.

3 Claims, 4 Drawing Sheets

BODY CONTACT FOR A MOSFET DEVICE FABRICATED IN AN SOI LAYER

This application is a continuation of Ser. No. 08/697,708 filed Aug. 28, 1996, now abandoned, which is a division of Ser. No. 08/565,201, filed Nov. 9, 1995 now U.S. Pat. No. 5,573,961.

BACKGROUND OF THE INVENTION

(1) FIELD OF THE INVENTION

This present invention relates to the fabrication of a semiconductor device, and more specifically to a semiconductor device fabricated from silicon on insulator, (SOI) technology.

(2) DESCRIPTION OF PRIOR ART

The objective of the semiconductor industry is to continually decrease the cost of manufacturing semiconductor chips, while still increasing the performance of these same chips. Micro-miniaturazation, or the ability to create shapes and images with sub-micron dimensions, has allowed these objectives to be partially realized. Advances in specific semiconductor disciplines, such as photolithography, via more sophisticated exposure cameras, as well as more sensitive photoresist materials, have allowed sub-micron images, in photoresist layers, to be routinely obtained. In addition similar developments in the dry etching discipline has allowed these sub-micron images in photoresist to be accurately transferred to underlying semiconductor materials, used for the fabrication of advanced devices. The creation of sub-micron shapes allow for the fabrication of smaller chips, resulting in more chips per wafer, and thus reducing costs. In addition smaller shapes result in a decrease in junction capacitance, as well as specific resistances, thus also improving device performance.

Although micro-miniaturazation has allowed the cost and performance objectives to be partially met, the semiconductor industry continues to evaluate additional methods to surpass these objectives. The development of silicon on insulator, (SOI), has resulted in significant performance improvements, when compared to counterparts fabricated using conventional processes. The SOI technology, in which devices are fabricated in a thin layer of silicon, which in turn overlies an insulator, removes a large portion of the diffusion to substrate parasitic capacitance, thus resulting in device performance benefits. Metal oxide semiconductor field effect transistors, (MOSFET), have been fabricated using SOI concepts. For example Houston, et al, in U.S. Pat. No. 5,185,280, as well as Iwamatsu, et al, in U.S. Pat. No. 5,294,821, have described methods for fabricating MOSFETs using SOI. However specific fabrication steps, needed to contact specific regions of a MOSFET device, to avoid deleterious device characteristics, have not been shown. For example a MOSFET fabricated without direct contact to a channel region, or with a body floating, will experience a "kink" effect, or suffer from a low, source to drain breakdown voltage, $BV_{dB}$. MOSFETs fabricated with body contacts, in the past, have added considerable complexity and cost to the process, in terms of additional layers. This invention will describe a process for providing a body contact to a MOSFET chip, by only including a masking and ion implantation sequence, to the MOSFET fabrication process flow.

SUMMARY OF THE INVENTION

It is an object of this invention to fabricate MOSFET devices in an SOI layer.

It is another object of this invention to provide a body contact to the SOI layer.

It is yet another object of this invention to provide a process sequence which allows for a compatible incorporation of the body contact structure, into the MOSFET process flow.

It is still yet another object of this invention to use an heavily doped P type region, obtained via ion implantation through a metal silicide layer, into the SOI layer, as the body contact.

In accordance with the present invention a P type, single crystalline, silicon layer is present on a silicon oxide layer, which in turn resides on a semiconductor substrate. Thick field oxide regions are thermally grown for purposes of isolation, followed by the growth of a thin silicon dioxide film, to be used as the MOSFET gate oxide. A polysilicon layer is grown, doped via ion implantation processes, and patterned to produce a polysilicon gate structure. A lightly doped, N type, source and drain region is formed via ion implantation processing. An insulator sidewall spacer is formed on the sides of the polysilicon gate structure by first depositing an insulator, and then using anisotropic etching to create the insulator spacer. A photoresist masking step is used to blockout only a specific region, of a specific MOSFET device, from a heavily doped, N type, ion implantation, used to create the source and drain regions of the MOSFET devices. A titanium layer is next deposited, and subjected to annealing cycles, used to create the metal silicide in regions in which titanium interfaced silicon. Unreacted titanium, existing in regions where titanium interfaced insulator, is removed using selective wet etchants. A layer of silicon oxide is deposited, followed by patterning used to open contact holes to the all heavily doped N type, source and drain regions, as well as opening a contact hole to the region that will used for the body contact, that did not receive the heavily doped, N type process. Another photoresist masking step is then used, to expose the region that was previously blocked from the heavily doped N type ion implantation, but now is subjected to a heavily doped, P type ion implantation, to create the body contact region. A rapid thermal anneal cycle is used to drive in the P type spices.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
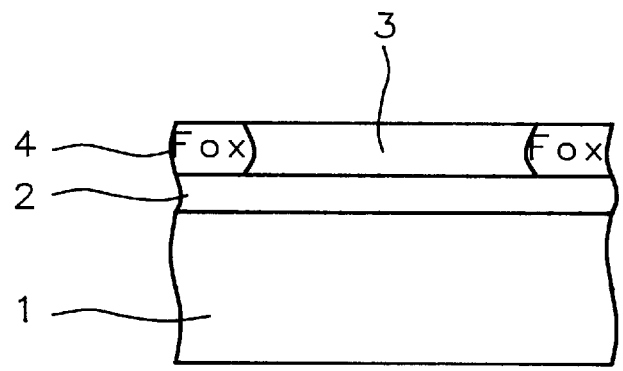
FIGS. 1–6, which schematically, in cross-sectional style, shows specific stages of fabrication for MOSFET devices, in SOI, with a body contact.

The method of creating MOSFET devices, with body contacts to an SOI layer, will now be described. FIG. 1, shows a starting substrate, 1, with a silicon oxide region, 2, and a silicon on insulator layer, 3. The method used to produce the silicon on insulator layer, (SOI), is SIMOX, (Separation by IMplanted OXygen). This method results in a buried oxide layer, 2, of between about 3000 to 4000 Angstroms of silicon oxide, with an overlying silicon on insulator layer, 3, (SOI), of between about 1000 to 2000 Angstroms of single crystalline silicon. The SOI layer, 3, has a resistivity between about 15 to 25 ohm-cm, with a defect density of less than about 1E4 defects/cm$^2$.

Next a thick field oxide region, 4, (FOX), is grown for purposes of isolation. The FOX region is created by patterning a composite layer of underlying thermally grown, $SiO_2$, and an overlying chemically vapor deposited $Si_3N_4$ layer, using conventional photolithography and dry etching processing. After photoresist removal, via plasma oxygen ashing, followed by careful wet cleans, the composite insulator layer is used as an oxidation mask, and between about 2000 to 6000 Angstroms of FOX is thermally grown in a oxygen—steam ambient, at a temperature between about 900° to 1150° C. This is shown in FIG. 1.

Figure 2:
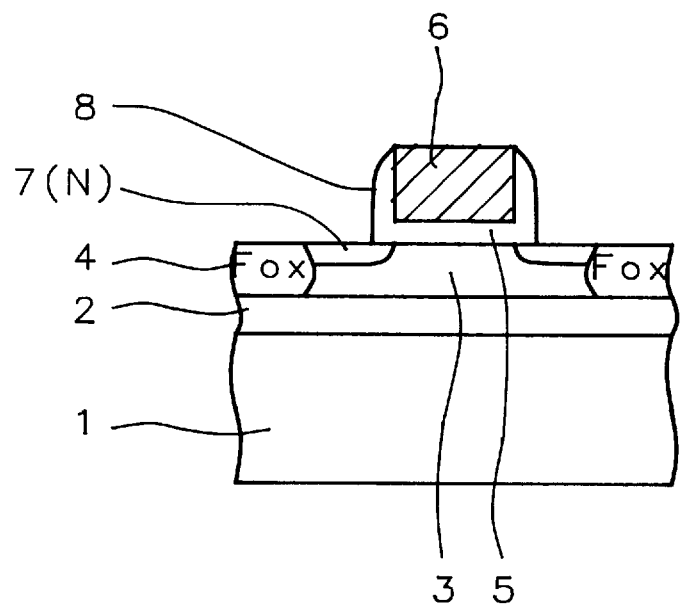

After removal of the composite insulator oxidation mask, using hot phosphoric acid for the $Si_3N_4$. layer, and hydrofluoric acid for the underlying $SiO_2$ layer, a thin silicon dioxide layer, 5, is regrown, at a temperature between about 800° to 1000° C., to a thickness between about 40 to 200 Angstroms, to be used as the gate insulator for the MOSFET device. This is shown in FIG. 2. A polysilicon layer is next deposited using low pressure chemical vapor deposition, (LPCVD), processing, at a temperature between about 500° to 650° C., to a thickness between about 1200 to 3000 Angstroms. An ion implantation of phosphorous, at an energy between about 50 to 100 Kev., at a dose between about 1E14 to 1E16 atoms/cm$^2$, is used for doping purposes. Standard photolithographic and reactive ion etching, (RIE), procedures, using $Cl_2$ as an etchant, are employed to form the polysilicon gate structure, 6, shown schematically in FIG. 2. After photoresist removal using plasma oxygen ashing, followed by careful wet cleans an ion implantation of phosphorous is performed at an energy between about 30 to 80 Kev., at a dose between about 1E12 to 1E14 atoms/cm$^2$, to create the N type, lightly doped source and drain regions, 7. An insulator sidewall spacer, 8, is next created on the sides of polysilicon gate structure, 6. The spacer is formed by initially depositing a layer of silicon oxide using either LPCVD or plasma enhanced chemical vapor deposition, (PECVD), processing, at a temperature between about 600° to 800° C., to a thickness between about 800 to 2500 Angstroms. A selective, anisotropic, RIE procedure, using $CHF_3$ as an etchant, is used to create insulator sidewall spacer, 8. The RIE procedure is selective, therefore N type, lightly doped source and drain regions, 7, are not etched during this procedure. This again is shown in FIG. 2.

Figure 3:
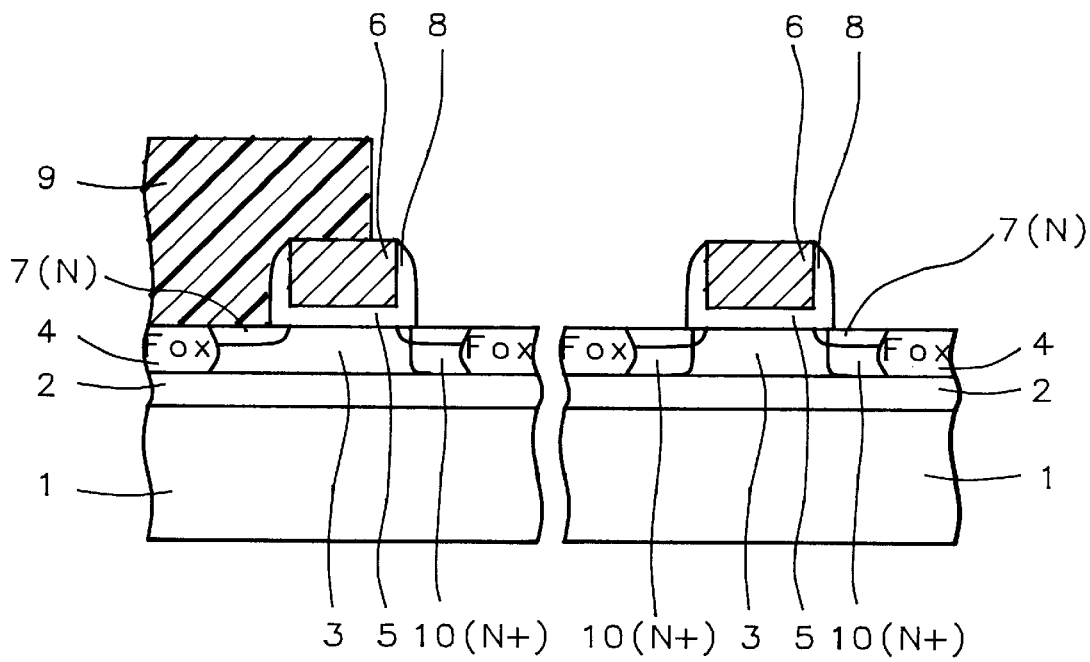

FIG. 3, will now show the formation of a specific MOSFET, to be used to provide body contact for the all the other MOSFETs in the chip. First a photoresist masking layer, 9, is used to blockout the region of the MOSFET that will be used to provide body contact. Next heavily doped, N type, source and drain regions, 10, are created, except in the blockout region where the body contact will be subsequently formed. The heavily doped source and drain regions, 10, are created via ion implantation of arsenic, at an energy between about 30 to 80 Kev., at a dose between about 1E14 to 1E16 atoms/cm$^2$. After photoresist removal via plasma oxygen ashing, followed by careful wet cleans, an anneal at a temperature between about 850° to 920° C., using a conventional furnace, is performed to drive in the source and drain regions.

Figure 4:
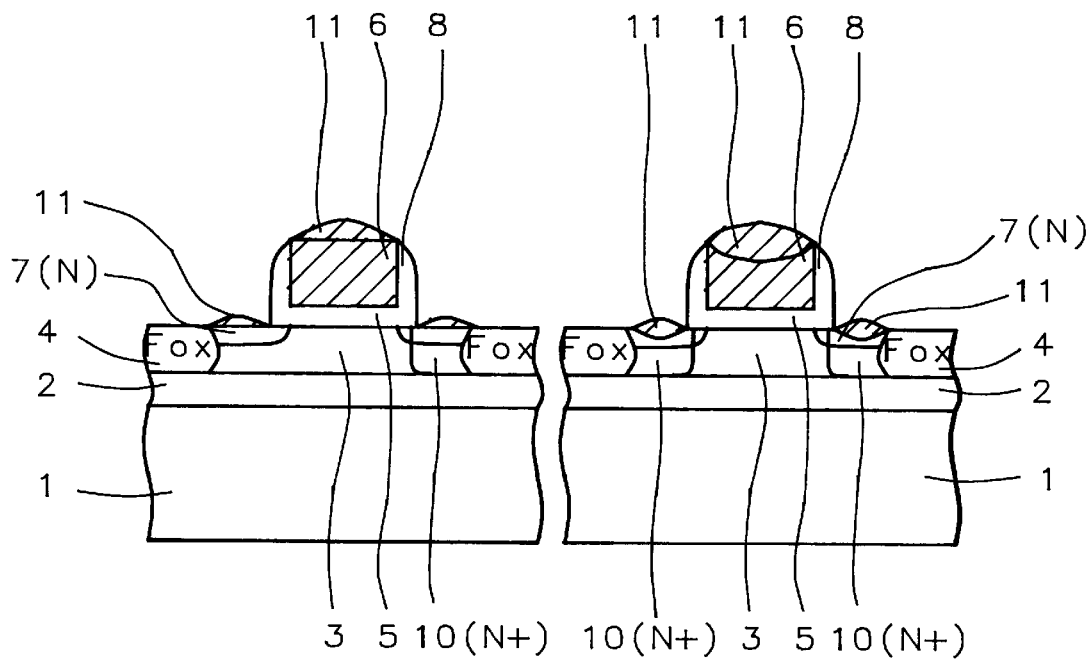

A dilute hydrofluoric acid treatment is then used to remove any native oxide films, followed by deposition of a layer of titanium, using r.f. sputtering, to a thickness between about 200 to 300 Angstroms. An anneal is performed to convert the titanium, interfacing silicon, to titanium silicide layer. The titanium that is on the insulator the insulator remains unreacted. The anneal can be performed in a conventional furnace, at a temperature between about 500° to 700° C., for a time between about 10 to 30 min., in an argon ambient. The conversion to a titanium silicide layer can also be accomplished via rapid thermal annealing processes, at a temperature between 600° to 900° C., for a time between about 30 to 120 sec. The resulting titanium silicide layer, 11, is between about 500 to 750 Angstroms. The unreacted titanium is than removed in a solution of about 5 parts water, to about 1 part hydrogen peroxide, and about 1 part ammonium hydroxide, at a temperature between about 50° to 750° C. This is schematically shown in FIG. 4.

Figure 5:
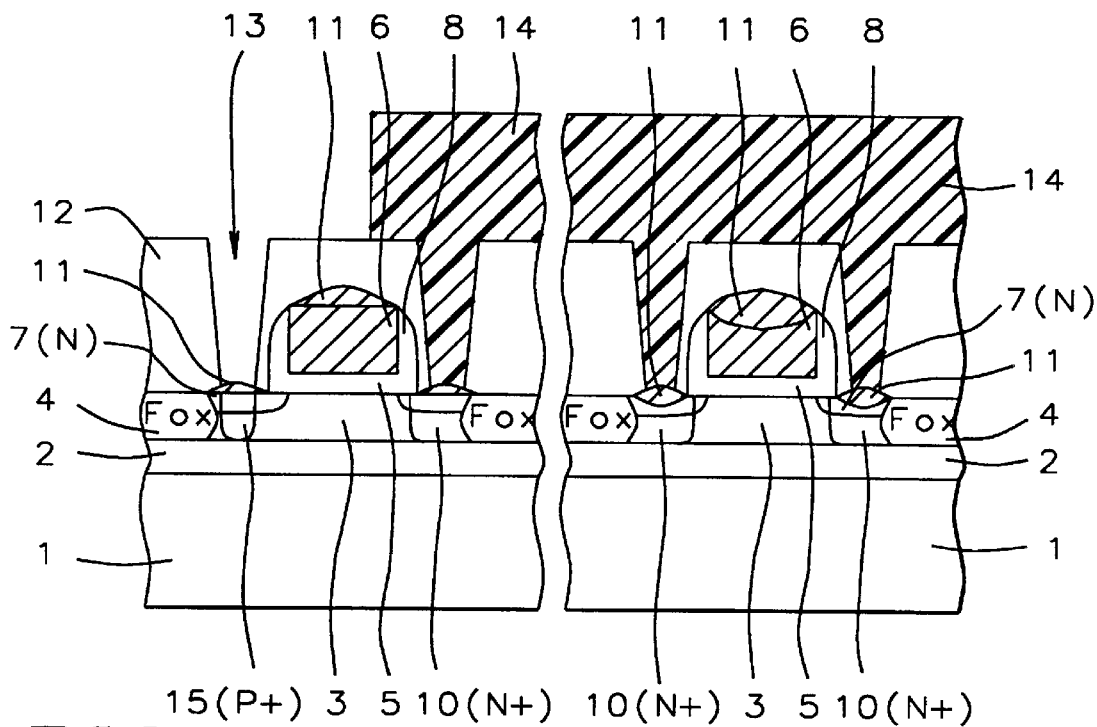
Figure 6:
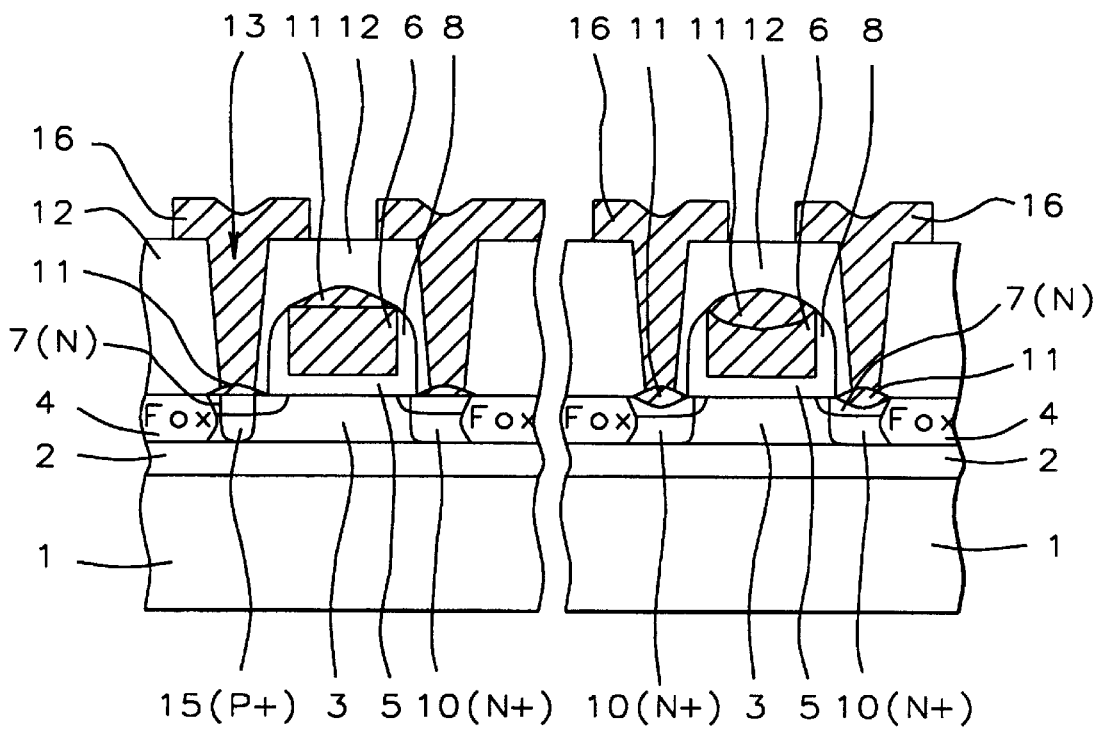
Figure 7:
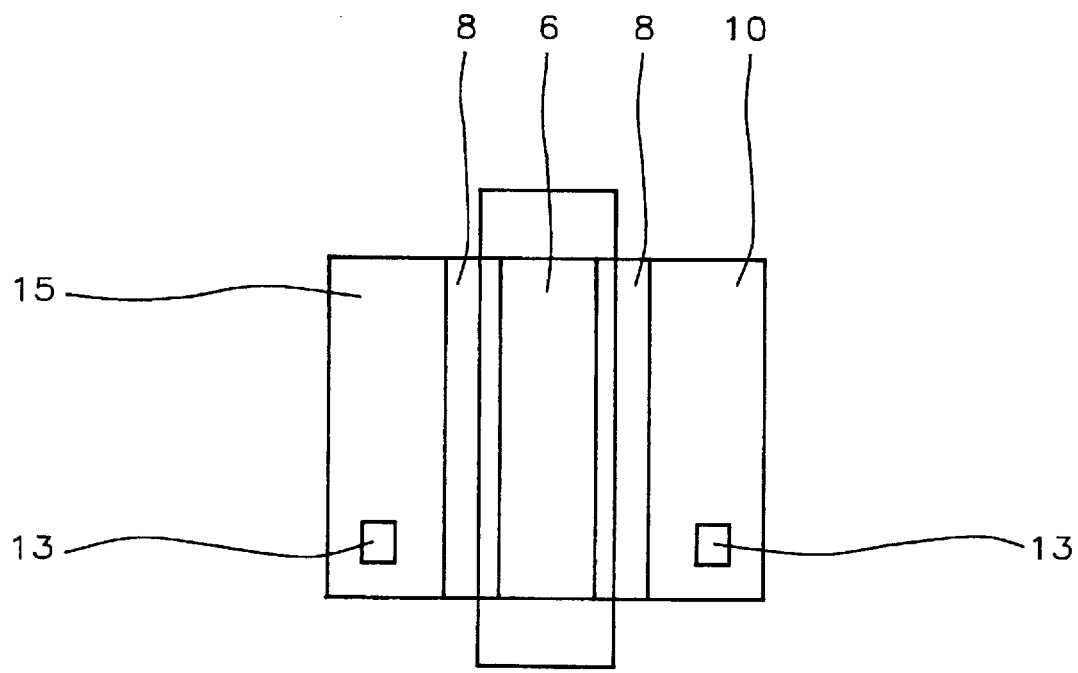
FIG. 7, schematically showing the top view of a MOSFET device, in SOI, with a body contact

A layer of silicon oxide, 12, is deposited using PECVD processing, at a temperature between about 300° to 450° C., to a thickness between about 5000 to 7000 Angstroms. Photolithographic and RIE processing, again using $CHF_3$ as an etchant, are employed to open contact holes, 13, to heavily doped, N type, source and drain regions, 10, as well as to lightly doped, N type region, 7, which will subsequently be converted to a heavily doped P type, body contact. After photoresist removal via plasma oxygen ashing and careful wet cleans, another photoresist masking layer, 14, is used to expose only an area where the body contact will be created. This is accomplished by a ion implantation of $BF_2$, at an energy between about 30 to 80 Kev., at a dose between about 1E14 to 1E16 atoms/cm$^2$. It should be noted that this critical ion implantation step is performed through the titanium silicide, 11, layer. After photoresist removal, again using plasma oxygen ashing wet cleans, another a rapid thermal anneal cycle is used, at a temperature between about 800° to 1100° C., for a time between about 20 to 100 sec., to create heavily doped P type, region, 15, to be used for contact to the P type, SOI layer. This is shown schematically in FIG. 5. The use of a body contact will result in constant drain currents, for a specific range of applied drain voltages. Counterparts, fabricated without body contact, or with body floating, will indicate unwanted or excess drain currents at specific drain voltage conditions, or the "kink" effect. Finally an aluminum based metallization is deposited, using r.f. sputtering, to a thickness between about 4000 to 6000 Angstroms. Standard photolithographic and RIE processing, using a $Cl_2$ containing etchant, is used to create aluminum contact structures, 16. FIG. 6, shows this stage of processing after photoresist removal, via plasma oxygen ashing and careful wet cleans. FIG. 7, schematically shows the top view of the MOSFET device, exhibiting the body contact.

Although this process for fabricating MOSFET devices, with a body contact to the SOI layer, has been shown as part of a N channel, (NFET), device, processing changes can easily be included to use the body contact as part of P channel, (PFET), devices, complimentary, (CMOS), devices, or BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, in a silicon on insulator layer, with a body contact to said silicon on insulator layer, self-aligned to a contact hole in an overlying dielectric layer, on a semiconductor substrate, comprising:

a first field oxide region, and a second field oxide region, in said silicon on insulator layer;

a device region between field oxide regions, in said silicon on insulator layer;

a polysilicon gate structure on said silicon on insulator layer, in center of said device region;

a first lightly doped source and drain region in the surface of said silicon on insulator layer, between said polysilicon gate structures and said first field oxide region;

a second lightly doped source and drain region in the surface of said silicon on insulator layer, between said polysilicon gate structure and said second field oxide region;

insulator spacers on the sides of the said polysilicon gate structure;

a heavily doped source and drain region in the surface of said silicon on insulator layer, between an insulator spacer, on a first side of said polysilicon gate structure, and said first field oxide region;

a first metal silicide layer on the surface of said heavily doped source and drain region, and a second metal silicide layer on the surface of said lightly doped source drain region;

an interlevel dielectric layer on the metal silicide layers, on said polysilicon gate structure, and on said field oxide regions;

a first contact hole, in said interlevel dielectric layer, exposing a portion of said first metal silicide layer, overlying said heavily doped source and drain region;

a second contact hole in said interlevel dielectric layer, exposing a portion of a second metal silicide layer;

a heavily doped body contact region, in said second lightly doped source and drain region, underlying the portion of said second metal silicide layer, exposed in said second contact hole, and with the width of said heavily doped body contact region, equal to the width of the bottom of said second contact hole, in said interlevel dielectric layer;

a first metal contact structure, in said first contact hole, contacting the portion of said first metal silicide, exposed in said first contact hole; and a second metal contact structure, in said second contact hole, contacting the portion of said second metal silicide layer, exposed in said second contact hole, wherein the width of the bottom of said second metal structure is equal to the width of said heavily doped body contact region.

2. The MOSFET device structure of claim 1, wherein said heavily doped source and drain regions are N type.

3. The MOSFET device structure of claim 1, wherein said heavily doped body contact is P type.

* * * * *